(12) United States Patent
Tachibana et al.

(10) Patent No.: US 10,121,630 B2
(45) Date of Patent: Nov. 6, 2018

(54) CONTROL DEVICE, CONTROL METHOD, AND ANALYSIS SYSTEM

(71) Applicant: JEOL Ltd., Tokyo (JP)

(72) Inventors: Kazuhiro Tachibana, Tokyo (JP); Hisashi Zaimoku, Tokyo (JP); Akira Abe, Tokyo (JP)

(73) Assignee: JEOL Ltd., Tokyo (JP)

( * ) Notice: Subject to any disclaimer, the term of this patent is extended or adjusted under 35 U.S.C. 154(b) by 415 days.

(21) Appl. No.: 15/137,452

(22) Filed: Apr. 25, 2016

(65) Prior Publication Data
US 2016/0313905 A1 Oct. 27, 2016

(30) Foreign Application Priority Data

Apr. 27, 2015 (JP) ................. 2015-090045

(51) Int. Cl.
*G06F 3/0484* (2013.01)
*H01J 37/22* (2006.01)
*G06F 3/0488* (2013.01)
*H01J 37/244* (2006.01)
*H01J 37/26* (2006.01)

(52) U.S. Cl.
CPC ............ *H01J 37/22* (2013.01); *G06F 3/0488* (2013.01); *G06F 3/04842* (2013.01); *H01J 37/244* (2013.01); *H01J 37/265* (2013.01); *H01J 2237/2442* (2013.01)

(58) Field of Classification Search
CPC ...... H01J 37/22; G06F 3/0488; G06F 3/0481; G06F 3/0484
See application file for complete search history.

(56) References Cited

U.S. PATENT DOCUMENTS

2014/0285198 A1* 9/2014 Halpern ................. G01R 33/60
324/316

FOREIGN PATENT DOCUMENTS

JP 3654551 B2 3/2005

* cited by examiner

*Primary Examiner* — Rashawn N Tillery
(74) *Attorney, Agent, or Firm* — The Webb Law Firm

(57) ABSTRACT

A control device that controls a spectrometer includes: a specimen image display control section that performs a control process that displays a specimen image acquired by the spectrometer on a display section; and an spectrometer control section that performs a control process that causes the spectrometer to start analysis based on designation of an analysis position within the specimen image that has been performed by a pointing device, and performs a control process that causes the spectrometer to stop the analysis based on cancellation of the designation of the analysis position that has been performed by the pointing device.

4 Claims, 14 Drawing Sheets

FG

FG

FG

FG

FG

CONTROL DEVICE, CONTROL METHOD, AND ANALYSIS SYSTEM

Japanese Patent Application No. 2015-090045, filed on Apr. 27, 2015, is hereby incorporated by reference in its entirety.

BACKGROUND OF THE INVENTION

The present invention relates to a control device, a control method, and an analysis system.

An electron microscope that includes an energy dispersive X-ray spectrometer (EDS) can perform analysis for obtaining elemental composition information about a specimen at an arbitrary position of the specimen.

For example, Japanese Patent No. 3654551 discloses an energy dispersive X-ray microanalyzer that is configured to allow the user to designate an analysis position within an electron microscope image displayed on the screen of a display device by using a pointing device, apply an electron beam to the designated analysis target position, and cause an energy dispersive X-ray spectrometer to start the acquisition of an X-ray spectrum.

When implementing analysis by using a spectrometer (e.g., electron microscope that includes an EDS), it is necessary to appropriately set the analysis conditions of the spectrometer in advance in order to acquire analysis data that is worth storing.

However, since such analysis is significantly affected by the state of the specimen, and it is difficult to employ common conditions, detailed analysis conditions are normally set after performing analysis under provisional analysis conditions. Therefore, it may be necessary to perform analysis a plurality of times under provisional analysis conditions in order to acquire analysis data that is worth storing, and it may take time to complete the analysis when the operability of the spectrometer is poor, for example.

SUMMARY

Several aspects of the invention may provide a control device and a control method that can improve the operability of a spectrometer. Several aspects of the invention may provide a spectrometry system (analysis system) that includes the control device.

According to a first aspect of the invention, there is provided a control device that controls a spectrometer, the control device including:

a specimen image display control section that performs a control process that displays a specimen image acquired by the spectrometer on a display section; and an spectrometer control section that performs a control process that causes the spectrometer to start analysis based on designation of an analysis position within the specimen image that has been performed by a pointing device, and performs a control process that causes the spectrometer to stop the analysis based on cancellation of the designation of the analysis position that has been performed by the pointing device.

According to a second aspect of the invention, there is provided a control device that controls a spectrometer, the control device including:

a specimen image display control section that performs a control process that displays a specimen image acquired by the spectrometer on a display section;

an icon display control section that performs a control process that displays an analysis start icon on the display section when designation of an analysis position within the specimen image has been performed by a pointing device; and an spectrometer control section that performs a control process that causes the spectrometer to start analysis based on an operation on the analysis start icon that has been performed by the pointing device, and performs a control process that causes the spectrometer to stop the analysis based on cancellation of the operation on the analysis start icon.

According to a third aspect of the invention, there is provided a control method that controls a spectrometer, the control method including:

performing a control process that displays a specimen image acquired by the spectrometer on a display section;

performing a control process that causes the spectrometer to start analysis based on designation of an analysis position within the specimen image that has been performed by a pointing device; and performing a control process that causes the spectrometer to stop the analysis based on cancellation of the designation of the analysis position that has been performed by the pointing device.

According to a fourth aspect of the invention, there is provided an analysis system including any one of the above control devices.

Figure 1:
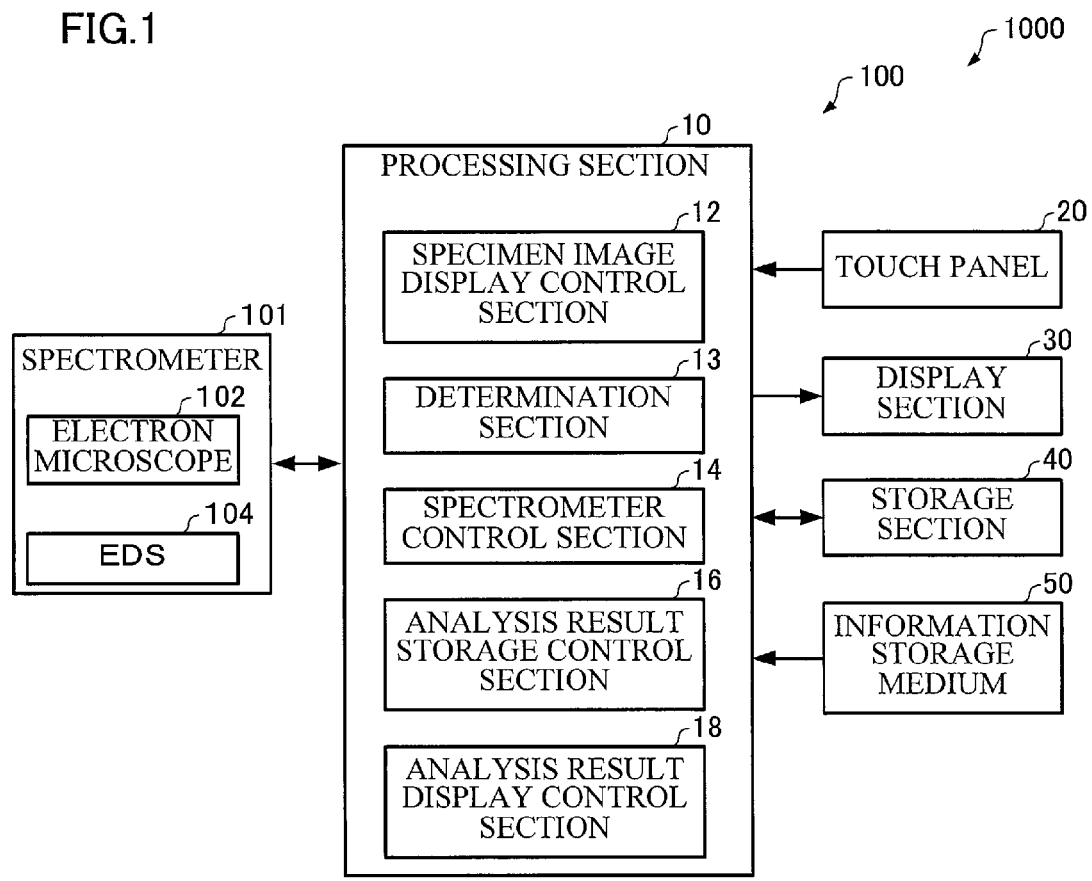
FIG. 1 is a functional block diagram illustrating an analysis system that includes a control device according to the first embodiment.

DETAILED DESCRIPTION OF THE EMBODIMENT (1) According to one embodiment of the invention, a control device that controls a spectrometer includes:

a specimen image display control section that performs a control process that displays a specimen image acquired by the spectrometer on a display section; and an spectrometer control section that performs a control process that causes the spectrometer to start analysis based on designation of an analysis position within the specimen image that has been performed by a pointing device, and performs a control process that causes the spectrometer to stop the analysis based on cancellation of the designation of the analysis position that has been performed by the pointing device.

The control device is configured so that the spectrometer control section performs the control process that causes the spectrometer to start the analysis based on the designation of the analysis position within the specimen image that has been performed by the pointing device, and performs the control process that causes the spectrometer to stop the analysis based on the cancellation of the designation of the analysis position that has been performed by the pointing device. According to this configuration, since the user need not operate an icon for starting analysis, an icon for stopping analysis, or the like, it is possible to improve the operability of the spectrometer.

(2) The control device may further include an analysis result display control section that performs a control process that displays analysis results of the spectrometer on the display section, and the analysis result display control section may start the control process that displays the analysis results on the display section based on the designation of the analysis position, and stop the control process that displays the analysis results on the display section based on the cancellation of the designation of the analysis position.

According to this configuration, since the user need not perform an operation that deletes unnecessary analysis results from the display section, it is possible to improve the operability of the spectrometer.

(3) The control device may further include an analysis result storage control section that performs a control process that stores analysis data output from the spectrometer in a storage section, and the analysis result storage control section may start the control process that stores the analysis data in the storage section based on the designation of the analysis position, and perform a process that deletes the analysis data stored in the storage section based on the cancellation of the designation of the analysis position.

According to this configuration, since the user need not perform an operation that deletes unnecessary analysis data from the storage section, it is possible to improve the operability of the spectrometer.

(4) According to another embodiment of the invention, a control device that controls a spectrometer includes:

a specimen image display control section that performs a control process that displays a specimen image acquired by the spectrometer on a display section;

an icon display control section that performs a control process that displays an analysis start icon on the display section when designation of an analysis position within the specimen image has been performed by a pointing device; and an spectrometer control section that performs a control process that causes the spectrometer to start analysis based on an operation on the analysis start icon that has been performed by the pointing device, and performs a control process that causes the spectrometer to stop the analysis based on cancellation of the operation on the analysis start icon.

The control device is configured so that the spectrometer control section performs the control process that causes the spectrometer to start the analysis based on the operation on the analysis start icon that has been performed by the pointing device, and performs the control process that causes the spectrometer to stop the analysis based on the cancellation of the operation on the analysis start icon. According to this configuration, since the user need not operate an icon for stopping analysis, or the like, it is possible to improve the operability of the spectrometer. It is also possible to reduce the possibility that it is erroneously determined that the user has performed an operation that designates the analysis position by using the pointing device, for example.

(5) According to another embodiment of the invention, a control method that controls a spectrometer includes:

performing a control process that displays a specimen image acquired by the spectrometer on a display section;

performing a control process that causes the spectrometer to start analysis based on designation of an analysis position within the specimen image that has been performed by a pointing device; and performing a control process that causes the spectrometer to stop the analysis based on cancellation of the designation of the analysis position that has been performed by the pointing device.

The control method includes performing the control process that causes the spectrometer to start the analysis based on the designation of the analysis position within the specimen image that has been performed by the pointing device, and performing the control process that causes the spectrometer to stop the analysis based on the cancellation of the designation of the analysis position that has been performed by the pointing device. According to this configuration, since the user need not operate an icon for starting analysis, an icon for stopping analysis, or the like, it is possible to improve the operability of the spectrometer.

(6) The control method may further include:

starting a control process that displays analysis results of the spectrometer on the display section based on the designation of the analysis position; and stopping the control process that displays the analysis results on the display section based on the cancellation of the designation of the analysis position.

According to this configuration, since the user need not perform an operation that deletes unnecessary analysis results from the display section, it is possible to improve the operability of the spectrometer.

(7) The control method may further include:

starting a process that stores analysis data output from the spectrometer in a storage section based on the designation of the analysis position; and performing a process that deletes the analysis data stored in the storage section based on the cancellation of the designation of the analysis position.

According to this configuration, since the user need not perform an operation that deletes unnecessary analysis data from the storage section, it is possible to improve the operability of the spectrometer.

(8) According to another embodiment of the invention, a control method that controls a spectrometer includes:

performing a control process that displays a specimen image acquired by the spectrometer on a display section;

performing a control process that displays an analysis start icon on the display section when designation of an analysis position within the specimen image has been performed by a pointing device;

performing a control process that causes the spectrometer to start analysis based on an operation on the analysis start icon that has been performed by the pointing device; and performing a control process that causes the spectrometer to stop the analysis based on cancellation of the operation on the analysis start icon.

The control method includes performing the control process that causes the spectrometer to start the analysis based on the operation on the analysis start icon that has been performed by the pointing device, and performing the control process that causes the spectrometer to stop the analysis based on the cancellation of the operation on the analysis start icon. According to this configuration, since the user need not operate an icon for stopping analysis, or the like, it is possible to improve the operability of the spectrometer. It is also possible to reduce the possibility that it is erroneously determined that the user has performed an operation that designates the analysis position by using the pointing device, for example.

(9) According to a further embodiment of the invention, there is provided an analysis system including any one of the above control devices.

Since the analysis system includes the control device, the analysis system can improve operability.

Exemplary embodiments of the invention are described in detail below with reference to the drawings. Note that the following exemplary embodiments do not unduly limit the scope of the invention as stated in the claims. Note also that all of the elements described below should not necessarily be taken as essential elements of the invention.

1. First Embodiment 1.1. Control Device

A control device according to a first embodiment of the invention is described below with reference to the drawings. FIG. 1 is an example of a functional block diagram illustrating an analysis system 1000 that includes a control device 100 according to the first embodiment.

The analysis system 1000 includes a spectrometer 101 and the control device 100.

The spectrometer 101 is a device that can perform analysis for obtaining elemental composition information about a specimen at an arbitrary position of the specimen. In the example illustrated in FIG. 1, the spectrometer 101 is an electron microscope 102 that includes an energy dispersive X-ray spectrometer (EDS) 104. The electron microscope 102 is a transmission electron microscope (TEM), a scanning transmission electron microscope (STEM), or a scanning electron microscope (SEM), for example. An example in which the electron microscope 102 is a scanning electron microscope is described below.

The control device 100 is a device that controls the spectrometer 101. The control device 100 controls the electron microscope 102 and the EDS 104. Since the analysis system 1000 is configured so that both the electron microscope 102 and the EDS 104 can be controlled by one control device 100, it is possible to improve operability as compared with the case where a control device that controls the electron microscope and a control device that controls the EDS are provided separately, for example.

The control device 100 includes a processing section 10, a touch panel 20 (i.e., pointing means), a display section 30, a storage section 40, and an information storage medium 50.

The touch panel 20 allows the user to input operation information, and outputs the input operation information to the processing section 10. The touch panel 20 outputs information (input information) input by performing a touch operation (designation operation) on the touch panel to the processing section 10. The touch panel 20 may be implemented by a (4-wire or 5-wire) resistive film technique, a capacitive coupling technique, an ultrasonic surface acoustic wave technique, an infrared scan technique, or the like. The touch panel 20 is provided to the display area of the display section 30, and forms a touch panel display together with the display section 30. A touch operation on the touch panel 20 may be performed with a fingertip, or may be performed by using a touch pen or the like.

The display section 30 displays an image generated by the processing section 10. The function of the display section 30 may be implemented by an LCD, a CRT, a touch panel display that includes the touch panel 20, or the like.

The storage section 40 serves as a work area for the processing section 10. The function of the storage section 40 may be implemented by a RAM or the like. The information storage medium 50 (computer-readable medium) stores a program, data, and the like. The function of the information storage medium 50 may be implemented by an optical disk (CD or DVD), a magneto-optical disk (MO), a magnetic disk, a hard disk, a magnetic tape, a memory (ROM), or the like. The processing section 10 performs various processes according to the first embodiment based on a program (data) stored in the information storage medium 50. The information storage medium 50 may store a program that causes a computer to function as each section of the processing section 10.

Analysis data output from the spectrometer 101 is stored in the storage section 40, for example. The analysis data is EDS spectral data, for example.

The processing section 10 performs a process that displays a specimen image (electron microscope image) acquired by the spectrometer 101 and the analysis results (e.g., EDS spectrum) of the spectrometer 101 on the display section 30, a process that stores the analysis data output from the spectrometer 101 in the storage section 40, a process that controls the spectrometer 101, and the like. The function of the processing section 10 may be implemented by hardware such as a processor (e.g., CPU or DSP) or an ASIC (e.g., gate array), or a program. The processing section 10 includes a specimen image display control section 12, a determination section 13, an spectrometer control section 14, an analysis result storage control section 16, and an analysis result display control section 18.

The specimen image display control section 12 performs a control process that displays the specimen image (electron microscope image) acquired by the spectrometer 101 on the display section 30.

The determination section 13 performs a process that determines whether or not the designation of an analysis position within the specimen image displayed on the display section 30 has been performed. The determination section 13 also performs a process that determines whether or not the designation of the analysis position has been canceled.

In the first embodiment, the designation of the analysis position is performed by the user by touching an arbitrary position within the specimen image displayed on the display section 30 with a fingertip (or by using a touch pen or the like) (touch operation), for example. The determination section 13 determines that the designation of the analysis position has been performed when the touch panel 20 has detected a touch operation (touch operation on the touch panel 20) within the specimen image displayed on the display section 30.

In the first embodiment, the cancellation of the analysis position is performed by the user by removing the tip of a finger FG from the analysis position within the specimen image (touch cancellation operation), for example. The determination section 13 determines that the cancellation of the designation of the analysis position has been performed when the touch panel 20 has detected that the touch operation performed at the analysis position within the specimen image displayed on the display section 30 has been canceled (i.e., when a touch cancellation operation has been detected).

The spectrometer control section 14 performs a process that controls the spectrometer 101. The analysis result storage control section 16 performs a control process that stores the analysis data output from the spectrometer 101 in the storage section 40. The analysis result display control section 18 performs a control process that displays the analysis results of the spectrometer 101 on the display section 30.

The control device 100 operates in an instant analysis mode (hereinafter may be referred to as "first mode") or a main analysis mode (hereinafter may be referred to as "second mode"). The first mode is a mode in which preliminary analysis (measurement) for determining the analytical conditions is performed. The second mode is a mode in which analysis data that is worth storing, is acquired.

The first mode is described below.

In the first mode, the spectrometer control section 14 performs a control process that causes the spectrometer 101 to start analysis based on the designation of the analysis position within the specimen image displayed on the display section 30 that has been performed by the touch panel 20, and performs a control process that causes the spectrometer 101 to stop analysis based on the cancellation of the designation of the analysis position that has been performed by the touch panel 20. The spectrometer control section 14 performs the control process that causes the spectrometer 101 to start analysis when the determination section 13 has determined that the designation of the analysis position has been performed. The spectrometer control section 14 performs the control process that causes the spectrometer 101 to stop analysis when the determination section 13 has determined that the designation of the analysis position has been canceled.

In the first mode, the analysis result storage control section 16 performs the process that stores the analysis data in the storage section 40 based on the designation of the analysis position performed by the touch panel 20, and performs a process that deletes the analysis data stored in the storage section 40 based on the cancellation of the designation of the analysis position performed by the touch panel 20. For example, the analysis result storage control section 16 performs the process that stores the analysis data in the storage section 40 in the first mode when the determination section 13 has determined that the designation of the analysis position has been performed. The analysis result storage control section 16 performs the process that deletes the analysis data stored in the storage section 40 when the determination section 13 has determined that the designation of the analysis position has been canceled.

The analysis data (EDS spectral data) is integrated until the analysis result storage control section 16 performs the process that deletes the analysis data after starting the process that stores the analysis data. In the first embodiment, the analysis data is data (EDS spectral data) based on an X-rays signal analyzed and detected by a detector of the EDS 104, and stored (integrated) in the storage section 40 corresponding to the electrical pulse height (X-ray energy value) through a multi-channel analyzer (not illustrated in FIG. 1).

In the first mode, the analysis result display control section 18 starts the process that displays the analysis results (EDS spectrum) on the display section 30 based on the designation of the analysis position performed by the touch panel 20, and stops the process that displays the analysis results (EDS spectrum) on the display section 30 based on the cancellation of the designation of the analysis position performed by the touch panel 20. For example, the analysis result display control section 18 starts the process that displays the analysis results on the display section 30 in the first mode when the determination section 13 has determined that the designation of the analysis position has been performed. The analysis result display control section 18 stops the process that displays the analysis results on the display section 30 when the determination section 13 has determined that the designation of the analysis position has been canceled. Specifically, the analysis results are not displayed on the display section 30 when the designation of the analysis position has been canceled.

The second mode is described below.

In the second mode, the spectrometer control section 14 performs the control process that causes the spectrometer 101 to start analysis in response to an operation performed on an analysis start icon displayed on the display section 30 after the designation of the analysis position within the specimen image displayed on the display section 30 has been performed by the touch panel 20, and performs the control process that causes the spectrometer 101 to stop analysis when a predetermined time set in advance has elapsed, or in response to an operation performed on an analysis stop icon.

In the second mode, the analysis result storage control section 16 starts the process that stores the analysis data output from the spectrometer 101 in the storage section 40 (process that integrates the analysis data) in response to an operation performed on the analysis start icon displayed on the display section 30, and stops the process that integrates the analysis data when a predetermined time set in advance has elapsed, or in response to an operation performed on the analysis stop icon.

In the second mode, the analysis result display control section 18 starts the control process that displays the analysis results (EDS spectrum) on the display section 30 in response to an operation performed on the analysis start icon displayed on the display section 30, and performs the control process that displays the analysis results on the display section 30 until the analysis start icon is operated again after completion of the analysis. Specifically, the analysis results are displayed on the display section 30 until the next analysis is performed, and the display of the analysis results is updated when the next analysis has started.

1.2. Method

The method according to the first embodiment is described below with reference to the drawings.

Figure 2:
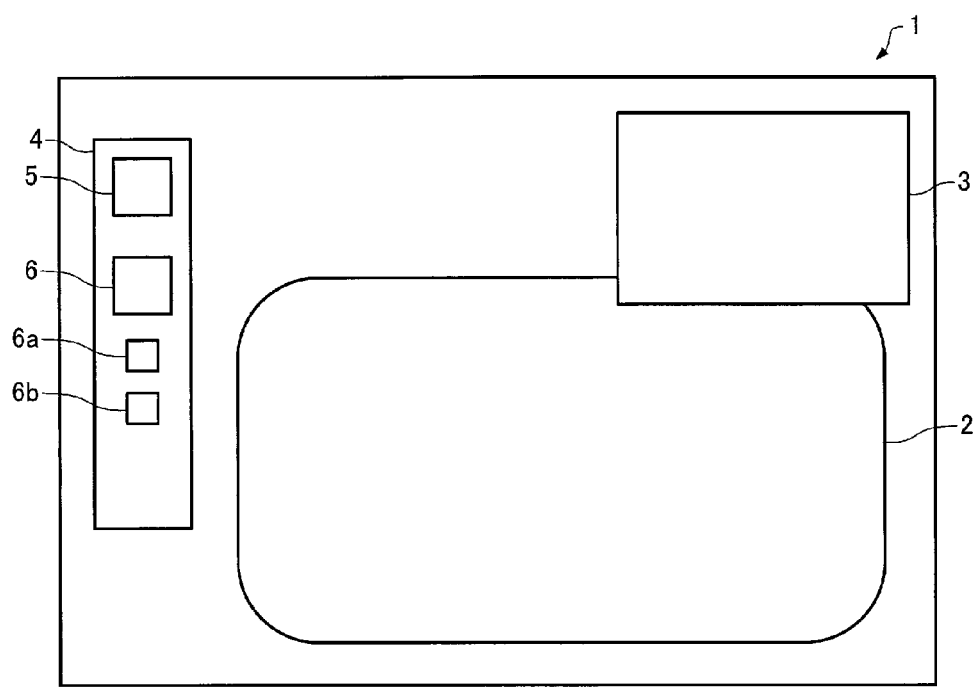
FIG. 2 illustrates an example of a setting screen used in connection with a control device according to the first embodiment.

FIG. 2 illustrates an example of a setting screen (graphical user interface (GUI)) 1 that is displayed on the touch panel display (i.e., the display section 30 that includes the touch panel 20).

As illustrated in FIG. 2, the setting screen 1 includes a specimen image display area 2, an analysis result display area 3, and an operation area 4.

A specimen image acquired by the spectrometer 101 is displayed in the specimen image display area 2. An electron microscope image is displayed in the specimen image display area 2, for example. The analysis results of the spectrometer 101 are displayed in the analysis result display area 3. An EDS spectrum is displayed in the analysis result display area 3, for example. GUI elements (e.g., button and icon) for operating the spectrometer 101 are displayed (placed) in the operation area 4. An instant analysis icon 5, a point analysis icon 6, an analysis start icon 6a, and an analysis stop icon 6b are displayed (placed) in the operation area 4. The control device 100 operates in the first mode when the instant analysis icon 5 has been operated, and operates in the second mode when the point analysis icon 6 has been operated.

Figure 3:
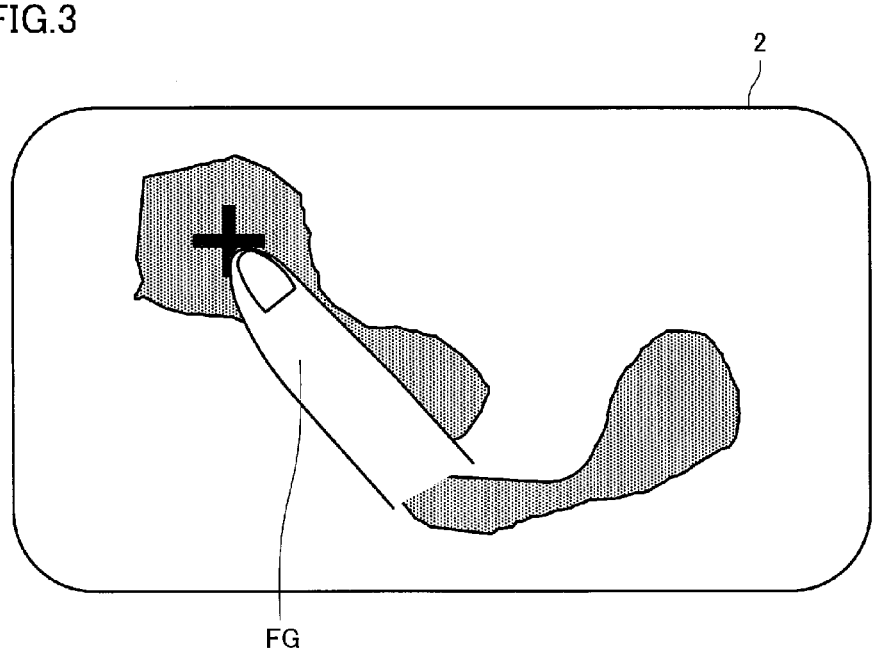
FIG. 3 illustrates an example of an operation that controls a spectrometer according to the first embodiment.
Figure 4:
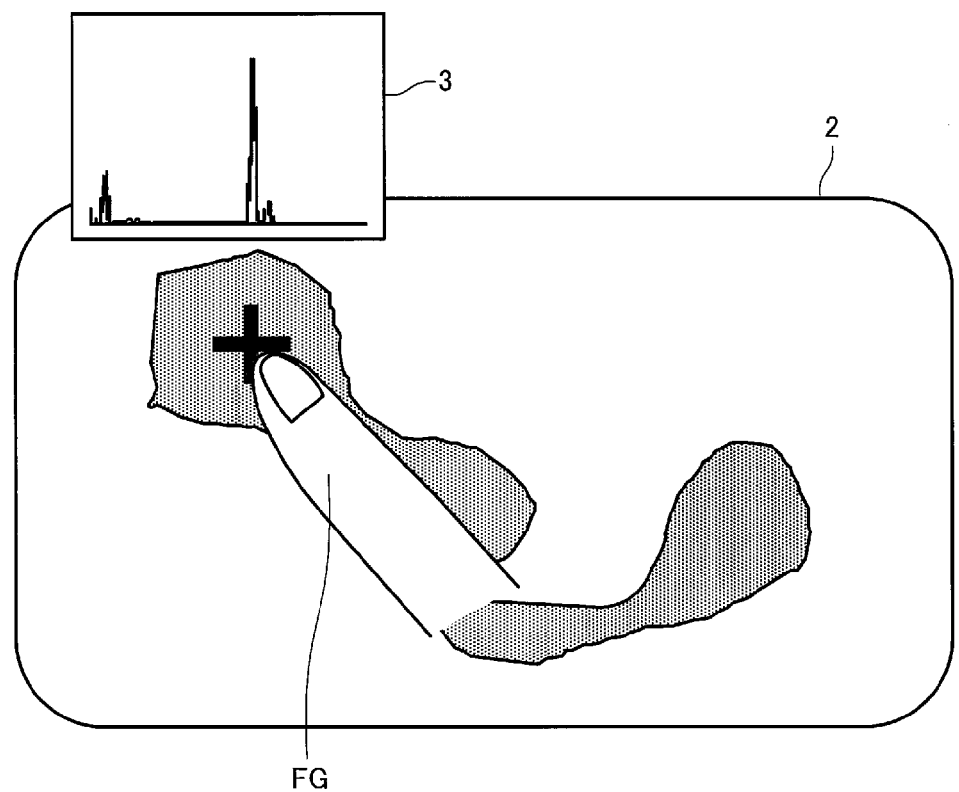
FIG. 4 illustrates an example of an operation that controls a spectrometer according to the first embodiment.
Figure 5:
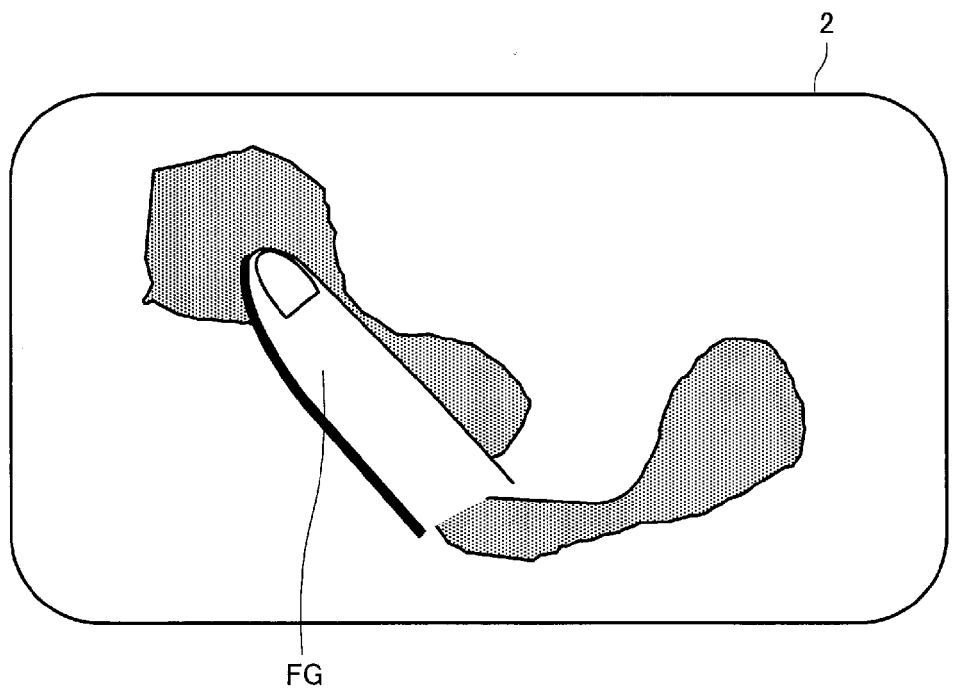
FIG. 5 illustrates an example of an operation that controls a spectrometer according to the first embodiment.

A case where the instant analysis icon 5 has been operated, and the control device 100 operates in the first mode is described below. FIGS. 3 to 5 illustrate examples of the operation that cause the control device 100 to control the spectrometer 101.

When the user has performed an operation that touches the instant analysis icon 5 with the tip of the finger FG (operation that presses the instant analysis icon (button) 5), the control device 100 operates in the first mode. In this case, the processing section 10 performs a control process that causes the spectrometer 101 to stop the electron beam scan.

As illustrated in FIG. 3, the user designates the analysis position by performing an operation that touches an arbitrary position within the specimen image (displayed in the specimen image display area 2) with the tip of the finger FG. The spectrometer 101 then starts analysis at the designated analysis position.

The analysis data output from the spectrometer 101 is stored in the storage section 40 when the spectrometer 101 has started analysis, and the EDS spectrum (analysis results) is displayed in the analysis result display area 3 (see FIG. 4). The user determines the composition at the analysis position by observing the display of the analysis results. The spectrometer 101 continuously performs analysis while the user performs the operation that touches the specimen image display area 2 with the tip of the finger FG, and the analysis data is continuously integrated. The integrated EDS spectrum is displayed in the analysis result display area 3 in real time. For example, when it is necessary to determine the presence or absence of a minute peak, the user can obtain a spectrum having a good S/N ratio by increasing the analysis time (i.e., increasing the time in which the user touches the specimen image display area 2 with the tip of the finger FG) to accurately determine the presence or absence of a minute peak. The user can immediately remove the tip of the finger FG from the specimen image display area 2 when the user has determined that the peak of the target element is not obtained. Specifically, the user can appropriately determine whether to increase or decrease the analysis time by observing the display of the integrated spectrum.

As illustrated in FIG. 5, the user cancels the designation of the analysis position by performing an operation (touch cancellation operation) that removes the tip of the finger FG from the specimen image display area 2). In this case, the spectrometer 101 immediately stops analysis. The display of the EDS spectrum in the analysis result display area 3 is stopped, and the analysis data stored in the storage section 40 is deleted.

A case where the point analysis icon 6 has been pressed, and the control device 100 operates in the second mode is described below. When the user has performed an operation that touches the point analysis icon 6 with the tip of the finger FG (operation that presses the point analysis icon (button) 6), the control device 100 operates in the second mode. In this case, the processing section 10 performs the control process that causes the spectrometer 101 to stop the electron beam scan.

As illustrated in FIG. 3, the user designates the analysis position by performing an operation that touches an arbitrary position within the specimen image (displayed in the specimen image display area 2) with the tip of the finger FG. When the user has performed an operation that touches the analysis start icon 6a with the tip of the finger FG, the spectrometer 101 starts analysis at the designated analysis position. When a predetermined time set in advance has elapsed, or when the user has performed an operation that touches the analysis stop icon 6b with the tip of the finger FG (operation that presses the analysis stop icon (button) 6b), the spectrometer 101 stops analysis. The EDS spectrum that has been displayed in the analysis result display area 3 remains displayed in the analysis result display area 3, and the integrated analysis data is stored in the storage section 40. Note that information about the analysis position is stored in the storage section 40 together with the analysis data.

1.3. Operation of Control Device

Figure 6:
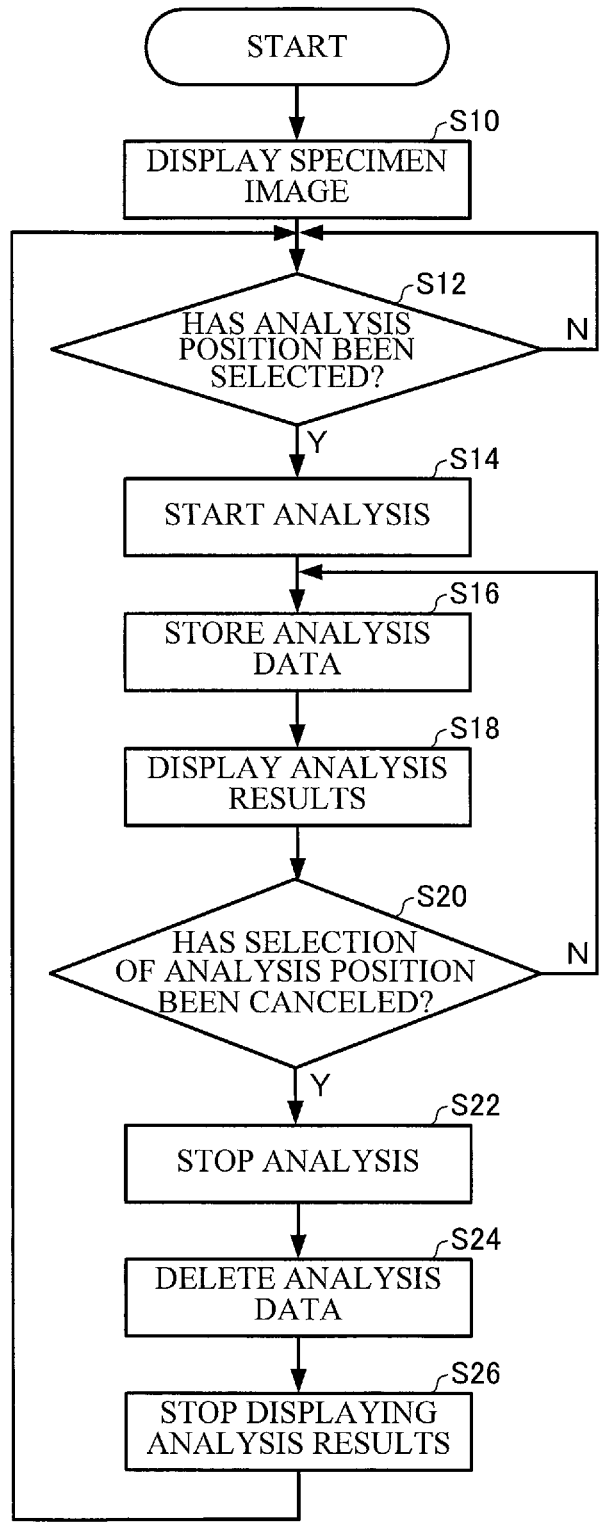
FIG. 6 is a flowchart illustrating an example of the operation of a control device according to the first embodiment.

The operation of the control device according to the first embodiment is described below. More specifically, the operation of the control device 100 in the first mode is described below. FIG. 6 is a flowchart illustrating an example of the operation of the control device 100.

The specimen image display control section 12 acquires the electron microscope image (specimen image) acquired by the electron microscope 102 included in the spectrometer 101, and performs the control process that displays the specimen image on the display section 30 (specimen image display area 2) (step S10).

The determination section 13 then determines whether or not the designation of the analysis position within the specimen image displayed on the display section 30 has been performed by the user (step S12).

The spectrometer control section 14 performs the control process that causes the spectrometer 101 to start analysis (step S14) when the determination section 13 has determined that the designation of the analysis position has been performed by the user ("Y" in step S12) (i.e., based on the designation of the analysis position performed by the touch panel 20).

The spectrometer control section 14 performs a process that transmits a control signal that causes the spectrometer 101 to start analysis to the spectrometer 101 immediately after the determination section 13 has determined that the designation of the analysis position has been performed, for example. The spectrometer 101 that has received the control signal applies an electron beam to the designated analysis position, and the EDS 104 detects a characteristic X-ray emitted from the specimen.

The analysis result storage control section 16 starts the process that stores the analysis data output from the spectrometer 101 in the storage section 40 (step S16) when the determination section 13 has determined that the designation of the analysis position has been performed by the user ("Y" in step S12).

The analysis result display control section 18 starts the control process that displays the EDS spectrum (analysis results) on the display section 30 (step S18) when the determination section 13 has determined that the designation of the analysis position has been performed by the user ("Y" in step S12). The analysis result display control section 18 reads the analysis data stored in the storage section 40, and performs the control process that displays the EDS spectrum on the display section 30, for example.

The determination section 13 then determines whether or not the designation of the analysis position within the specimen image displayed on the display section 30 has been canceled by the user (step S20).

The spectrometer control section 14 performs the control process that causes the spectrometer 101 to stop analysis (step S22) when the determination section 13 has determined that the designation of the analysis position has been canceled by the user ("Y" in step S20) (i.e., based on the cancellation of the designation of the analysis position performed by the touch panel 20).

The spectrometer control section 14 performs a process that transmits a control signal that causes the spectrometer 101 to stops analysis to the spectrometer 101 immediately after the determination section 13 has determined that the designation of the analysis position has been canceled by the user. The spectrometer 101 that has received the control signal stops applying an electron beam to the designated analysis position.

The analysis result storage control section 16 performs the process that deletes the analysis data stored in the storage section 40 (step S24) when the determination section 13 has determined that the designation of the analysis position has been canceled by the user ("Y" in step S20). The integrated analysis data stored in the storage section 40 is thus deleted.

The analysis result display control section 18 stops the control process that displays the EDS spectrum (analysis results) on the display section 30 (step S26) when the determination section 13 has determined that the designation of the analysis position has been canceled by the user ("Y" in step S20). Therefore, the EDS spectrum is not displayed on the display section 30 (analysis result display area 3). The steps S12 to S26 are then repeated.

The steps S16 and S18 are performed again when the determination section 13 has determined that the designation of the analysis position has not been canceled by the user ("N" in step S20). Specifically, the analysis data is integrated in the storage section 40, and the integrated EDS spectrum is continuously displayed on the display section 30.

The control device 100 has the following features, for example.

The control device 100 is configured so that the spectrometer control section 14 performs the control process that causes the spectrometer 101 to start analysis based on the designation of the analysis position within the specimen image that has been performed by the touch panel 20, and performs the control process that causes the spectrometer 101 to stop analysis based on the cancellation of the designation of the analysis position that has been performed by the touch panel 20. For example, the spectrometer 101 starts analysis when the user has performed an operation that touches an arbitrary position within the specimen image displayed in the specimen image display area 2 with the tip of the finger FG, and stops analysis when the user has performed an operation (touch cancellation operation) that removes the tip of the finger FG from the specimen image display area 2. According to this configuration, since the user need not operate an icon for starting analysis, an icon for stopping analysis, or the like, it is possible to improve the operability of the spectrometer, and reduce the analysis time.

The control device 100 is configured so that the analysis result storage control section 16 starts the process that stores the analysis data in the storage section 40 based on the designation of the analysis position within the specimen image that has been performed by the touch panel 20, and performs the process that deletes the analysis data stored in the storage section 40 based on the cancellation of the designation of the analysis position that has been performed by the touch panel 20. According to this configuration, since the user need not perform an operation that deletes unnecessary analysis data from the storage section 40, it is possible to improve the operability of the spectrometer.

The control device 100 is configured so that the analysis result display control section 18 starts the control process that displays the analysis results on the display section 30 based on the designation of the analysis position within the specimen image that has been performed by the touch panel 20, and stops the control process that displays the analysis results on the display section 30 based on the cancellation of the designation of the analysis position that has been performed by the touch panel 20. According to this configuration, since the user need not perform an operation that deletes unnecessary analysis results from the display section 30, it is possible to improve the operability of the spectrometer.

A control method according to the first embodiment includes a step that performs a control process that displays the specimen image photographed by the spectrometer 101 on the display section 30, a step that performs a control process that causes the spectrometer 101 to start analysis based on the designation of the analysis position within the specimen image that has been performed by the touch panel 20, and a step that performs a control process that causes the spectrometer 101 to stop analysis based on the cancellation of the designation of the analysis position that has been performed by the touch panel 20. Therefore, the control method according to the first embodiment can improve the operability of the spectrometer (see above).

Since the analysis system 1000 includes the control device 100, the analysis system 1000 can improve the operability of the spectrometer.

1.4. Modifications

Several modifications of the control device according to the first embodiment are described below. Note that the following description focuses on features that differ from the features described above in connection with the example of the control device according to the first embodiment, and description of identical features is omitted.

(1) First Modification

A first modification is described below. Note that the analysis system according to the first modification is configured in the same manner as the analysis system 1000 illustrated in FIG. 1, and illustration thereof is omitted.

The first embodiment has been described above taking an example in which the determination section 13 determines that the designation of the analysis position has been performed when the touch panel 20 has detected that the specimen image display area 2 has been touched (i.e., a touch operation has been performed on the specimen image display area 2).

In the first modification, the determination section 13 determines that the designation of the analysis position has been performed when the touch panel 20 has detected that the specimen image display area 2 has been continuously touched for a predetermined time (i.e., a touch operation has been continuously performed for a predetermined time). Specifically, the analysis position is designated when the user has continuously performed an operation that touches an arbitrary position within the specimen image (displayed in the specimen image display area 2 (touch panel display)) with the tip of a finger FG for a predetermined time. Note that the spectrometer 101 does not start analysis when the user has not continued an operation that touches an arbitrary position within the specimen image with the tip of a finger FG for a predetermined time.

According to the first modification, it is possible to reduce the possibility that it is erroneously determined that the user has performed an operation that designates the analysis position. For example, when the field of view of the specimen image is moved when the user has moved (slid) the tip of the finger FG in the desired direction in a state in which the user touches an arbitrary position within the specimen image display area 2 with the tip of the finger FG, an operation that moves the field of view of the specimen image may be erroneously determined to be an operation that designates the analysis position. According to the first modification, since the analysis position is designated when the user has continuously performed an operation that touches an arbitrary position within the specimen image with the tip of a finger FG for a predetermined time, it is possible to reduce the possibility that an operation that moves the field of view of the specimen image is erroneously determined to be an operation that designates the analysis position. The possibility that it is erroneously determined that the user has performed an operation that designates the analysis position by using the touch panel 20 can thus be reduced.

(2) Second Modification

Figure 7:
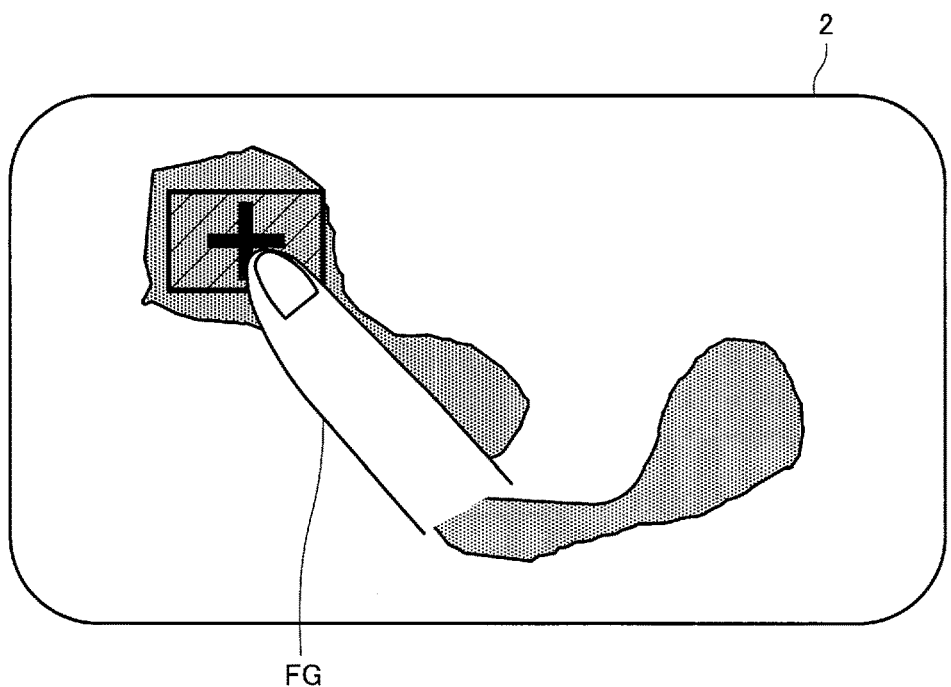
FIG. 7 illustrates an example of an operation that controls a spectrometer according to the second modification.
Figure 8:
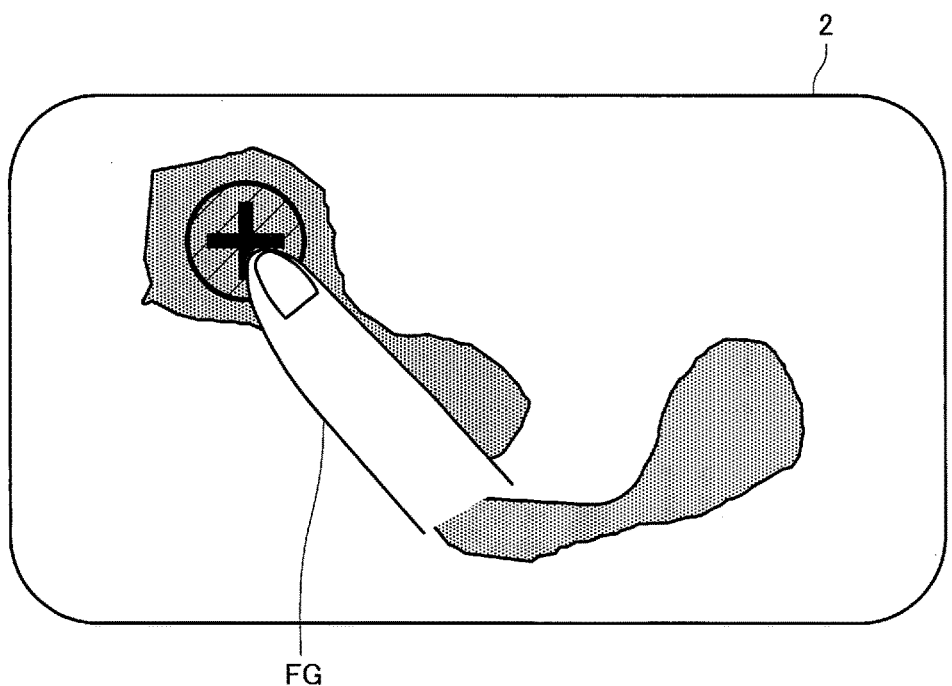
FIG. 8 illustrates an example of an operation that controls a spectrometer according to the second modification.
Figure 9:
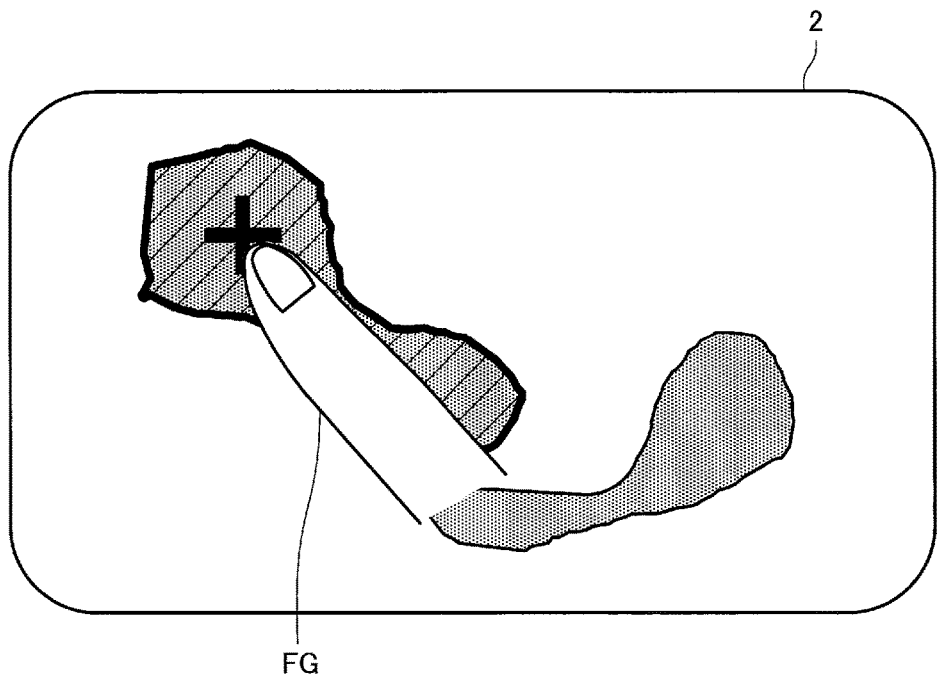
FIG. 9 illustrates an example of an operation that controls a spectrometer according to the second modification.

A second modification is described below. FIGS. 7 to 9 illustrate examples of the operation of the control device according to the second modification to control the spectrometer. Note that the analysis system according to the second modification is configured in the same manner as the analysis system 1000 illustrated in FIG. 1, and illustration thereof is omitted.

As illustrated in FIG. 7, the user designates the analysis position by performing an operation that touches an arbitrary position within the specimen image (displayed in the specimen image display area 2) with the tip of the finger FG. In the second modification, a predetermined range around the position designated by the user is designated to be the analysis position (analysis area), and the spectrometer 101 performs analysis within the predetermined range (area). Specifically, the spectrometer 101 applies an electron beam to the predetermined range when performing analysis. The size and the shape of the predetermined range may be set appropriately. In the example illustrated in FIG. 7, the predetermined range has a rectangular shape. In the example illustrated in FIG. 8, the predetermined range has a circular shape.

As illustrated in FIG. 9, a range (area) that is situated around the position designated by the user and includes pixels having the same brightness (or a brightness range within ±X grayscales) may be designated to be the analysis position.

(3) Third Modification

Figure 10:
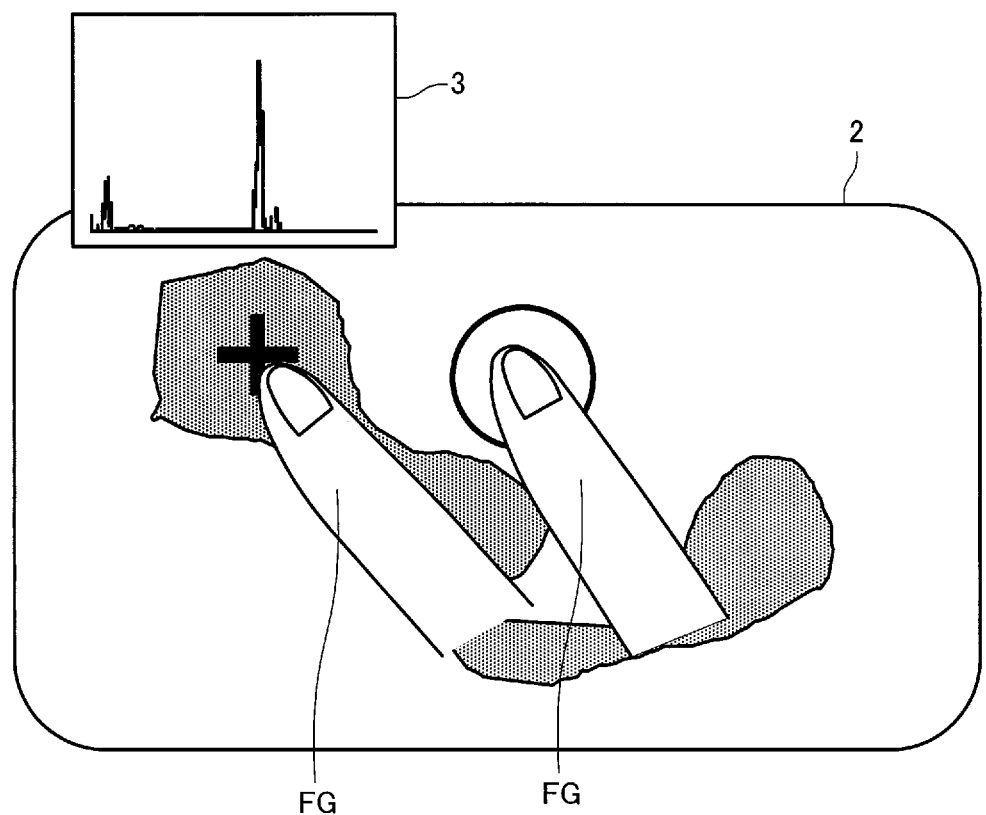
FIG. 10 illustrates an example of an operation that controls a spectrometer according to the third modification.

A third modification is described below. FIG. 10 illustrates an example of the operation of the control device according to the third modification to control the spectrometer. Note that the analysis system according to the third modification is configured in the same manner as the analysis system 1000 illustrated in FIG. 1, and illustration thereof is omitted. The third modification is described below with reference to FIGS. 3 to 5 and 10.

As illustrated in FIG. 3, the user designates the analysis position by performing an operation that touches an arbitrary position within the specimen image (displayed in the specimen image display area 2) with the tip of the finger FG. The spectrometer 101 then starts analysis at the designated analysis position. The analysis data output from the spectrometer 101 is stored in the storage section 40, and the EDS spectrum is displayed in the analysis result display area 3 (see FIG. 4).

FIG. 10 illustrates a state in which the user has performed an operation that touches an arbitrary position within the specimen image display area 2 with the tip of another finger FG without removing the tip of the finger FG from the analysis position. In this case, the analysis data stored in the storage section 40 is not deleted when the user has canceled the designation of the analysis position by performing an operation that removes the tip of the finger FG from the specimen image display area 2 (i.e., when the spectrometer 101 has stopped analysis) (see FIG. 5). In this case, the display of the EDS spectrum in the analysis result display area 3 may be stopped, or may be maintained.

According to the third modification, when the user has performed an operation that touches an arbitrary position within the specimen image display area 2 with the tip of another finger FG without removing the tip of the finger FG from the analysis position, the analysis result storage control section 16 performs a process that stores the analysis data in the storage section 40 together with the information about the analysis position without performing the process that deletes the analysis data stored in the storage section 40 based on the timing at which the designation of the analysis position has been canceled by the touch panel 20.

(4) Fourth Modification

Figure 11:
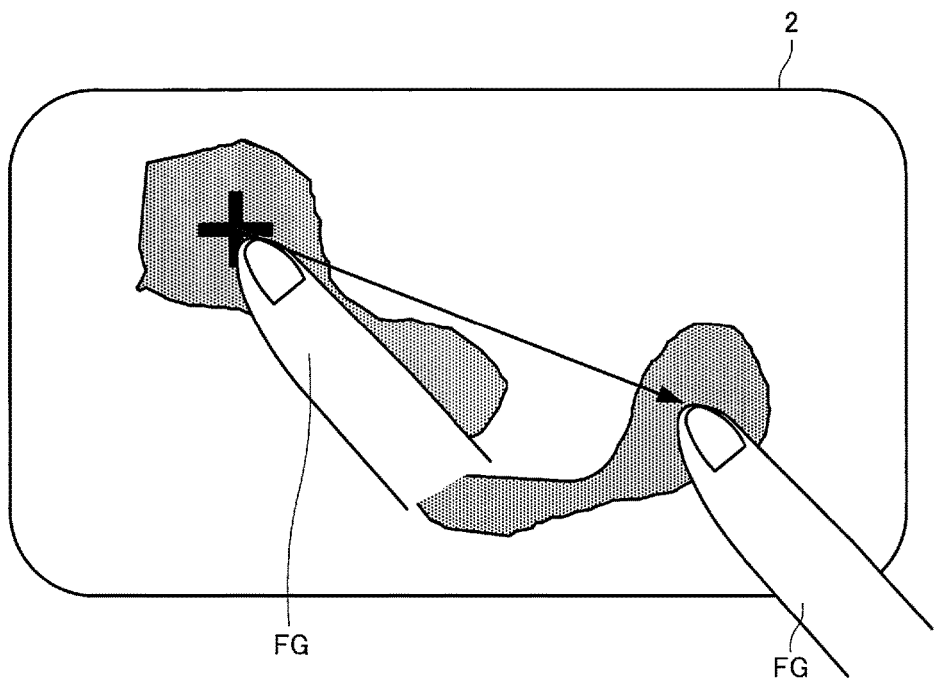
FIG. 11 illustrates an example of an operation that controls a spectrometer according to the fourth modification.
Figure 12:
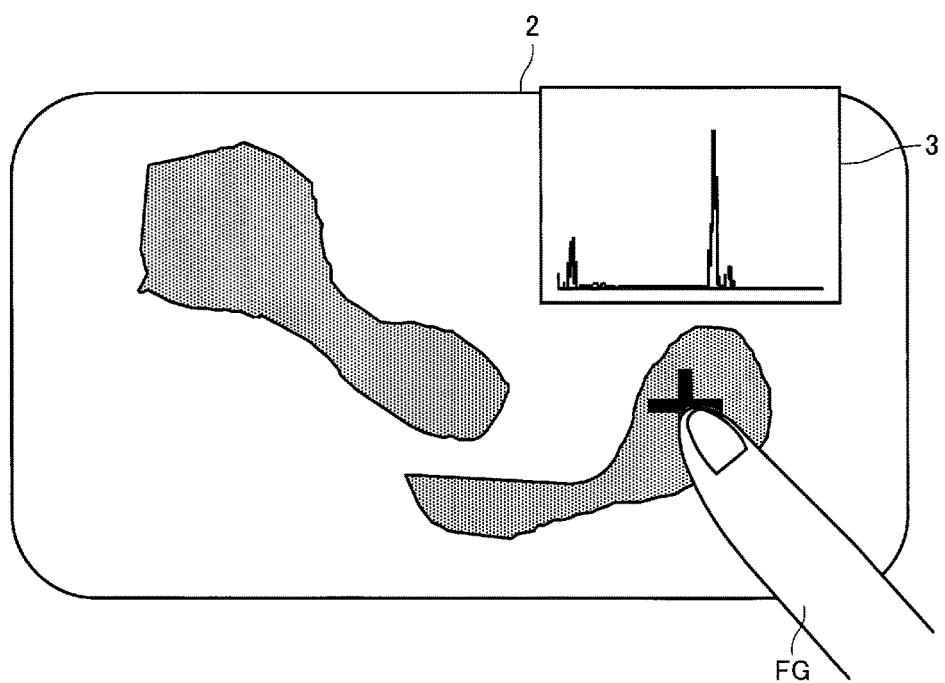
FIG. 12 illustrates an example of an operation that controls a spectrometer according to the fourth modification.

A fourth modification is described below. FIGS. 11 and 12 illustrate examples of the operation of the control device according to the fourth modification to control the spectrometer. Note that the analysis system according to the fourth modification is configured in the same manner as the analysis system 1000 illustrated in FIG. 1, and illustration thereof is omitted. The fourth modification is described below with reference to FIGS. 3, 4, 11, and 12.

As illustrated in FIG. 3, the user designates the analysis position by performing an operation that touches an arbitrary position within the specimen image (displayed in the specimen image display area 2) with the tip of the finger FG. The spectrometer 101 then starts analysis at the designated analysis position. The analysis data output from the spectrometer 101 is stored in the storage section 40, and the EDS spectrum is displayed in the analysis result display area 3 (see FIG. 4).

When the user has then performed an operation that moves the tip of the finger FG without removing the tip of the finger FG from the specimen image display area 2 (see FIG. 11), the position to which the tip of the finger FG has moved is designated to be the analysis position. The spectrometer 101 performs analysis at the analysis position to which the tip of the finger FG has been moved, and the analysis results obtained at the analysis position to which the tip of the finger FG has been moved are displayed in the analysis result display area 3 (see FIG. 12).

According to the fourth modification, when the analysis position has changed due to the movement of the tip of the finger FG on the touch panel 20 (specimen image display area 2), the spectrometer control section 14 performs a control process that causes the spectrometer 101 to start analysis at the analysis position that has changed.

2. Second Embodiment

2.1. Control Device

Figure 13:
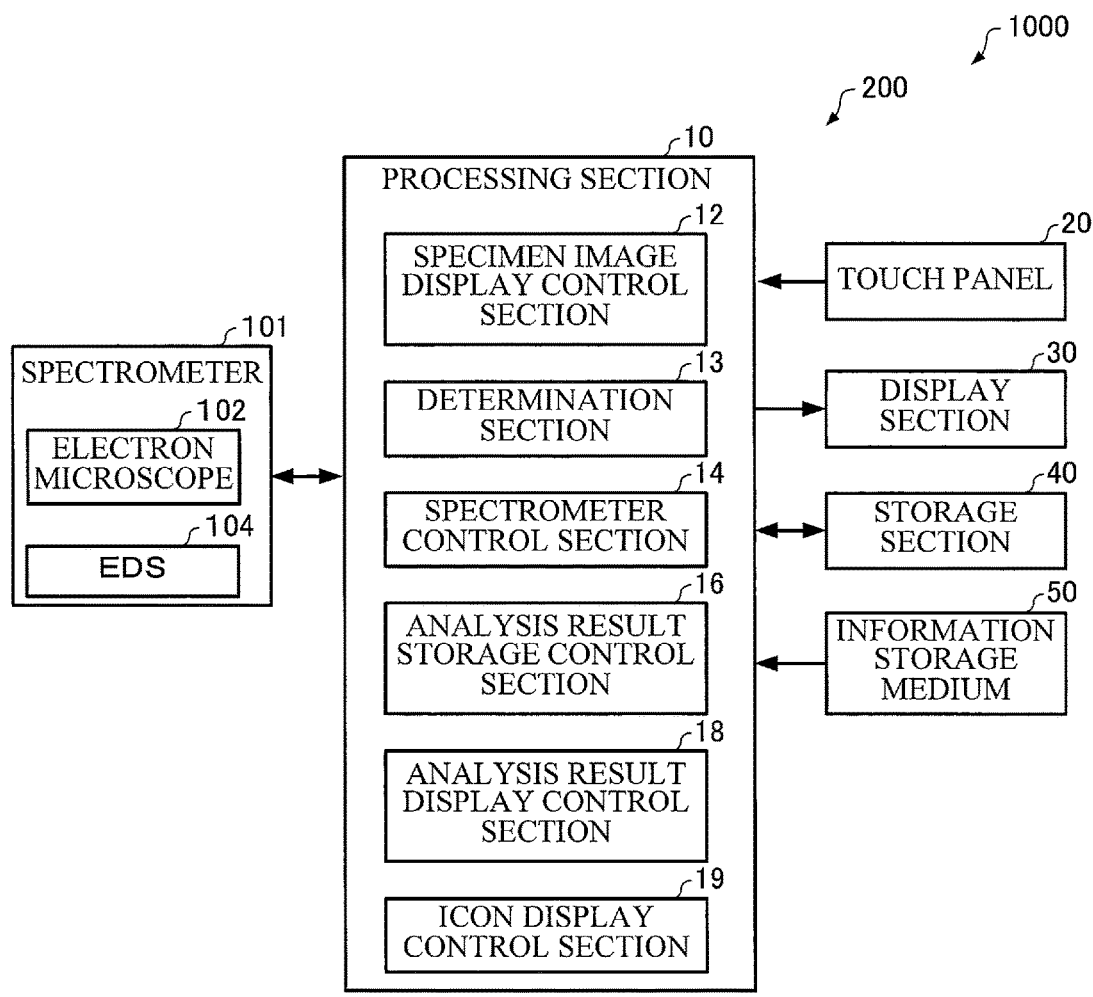
FIG. 13 is a functional block diagram illustrating an analysis system that includes a control device according to the second embodiment.

A control device according to a second embodiment is described below with reference to the drawings. FIG. 13 illustrates an example of a functional block diagram of an analysis system 1000 that includes a control device 200 according to the second embodiment. Note that the elements of the analysis system that includes the control device according to the second embodiment that are identical in function to those of the analysis system that includes the control device according to the first embodiment are indicated by the same reference signs (symbols), and detailed description thereof is omitted.

The analysis system 1000 includes the spectrometer 101 and the control device 200.

The processing section 10 included in the control device 200 includes an icon display control section 19 in addition to the specimen image display control section 12, the determination section 13, the spectrometer control section 14, the analysis result storage control section 16, and the analysis result display control section 18.

When the designation of the analysis position within the specimen image displayed on the display section 30 has been performed in the second mode by the touch panel 20, the icon display control section 19 performs a control process that displays an analysis start icon and an analysis cancellation icon on the display section 30. The analysis start icon is an icon that receives an operation that causes the spectrometer 101 to start analysis at the designated analysis position, and an operation that causes the spectrometer 101 to stop analysis. The analysis cancellation icon is an icon that receives an operation that cancels analysis at the designated analysis position.

In the second mode, the spectrometer control section 14 performs a control process that causes the spectrometer 101 to start analysis based on an operation on the analysis start icon that has been performed by the touch panel 20, and performs a control process that causes the spectrometer 101 to stop analysis based on the cancellation of the operation on the analysis start icon that has been performed by the touch panel 20.

Note that the operation of the control device 200 according to the second embodiment in the second mode is similar to the operation of the control device 100 in the second mode, and description thereof is omitted.

2.2. Method

The method according to the second embodiment is described below with reference to the drawings.

More specifically, the operation of the control device 200 in the first mode is described below. FIGS. 14 to 18 illustrate an example of the operation that causes the control device 200 to control the spectrometer 101.

Figure 14:
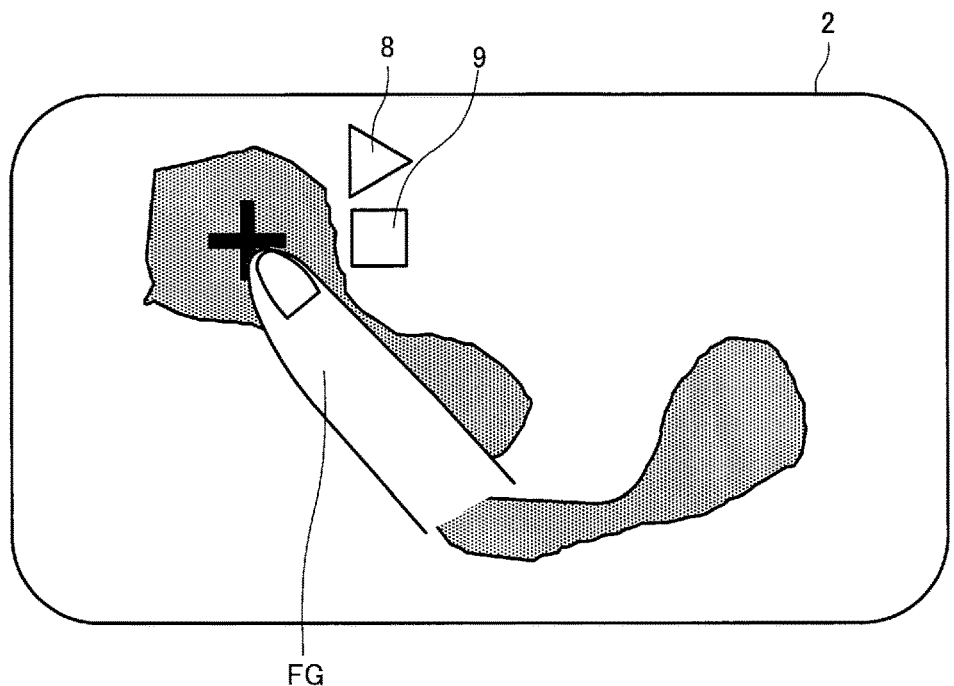
FIG. 14 illustrates an example of an operation that controls a spectrometer according to the second embodiment.
Figure 15:
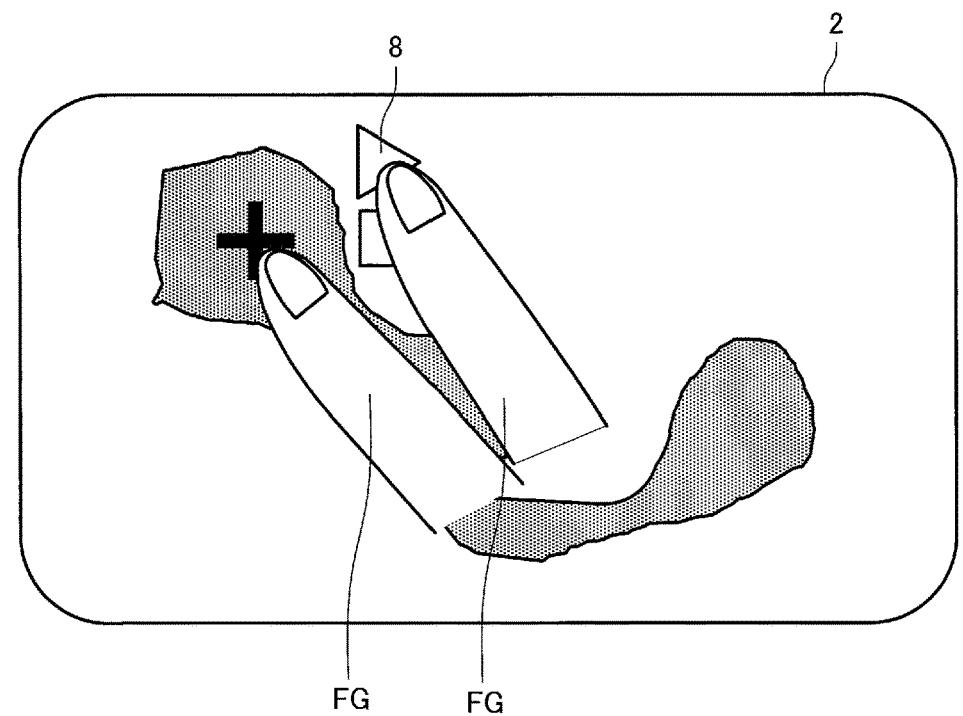
FIG. 15 illustrates an example of an operation that controls a spectrometer according to the second embodiment.

As illustrated in FIG. 14, the user designates the analysis position by performing an operation that touches an arbitrary position within the specimen image (displayed in the specimen image display area 2) with the tip of the finger FG. An analysis start icon 8 and an analysis cancellation icon 9 are then displayed in the vicinity of the designated analysis position. As illustrated in FIG. 14, the analysis start icon 8 and the analysis cancellation icon 9 are displayed in the vicinity of the designated analysis position.

When the user has performed an operation that touches the analysis start icon 8 with the tip of a finger FG other than the finger FG used to designate the analysis position (see FIG. 15), the spectrometer 101 starts analysis at the designated analysis position.

Figure 16:
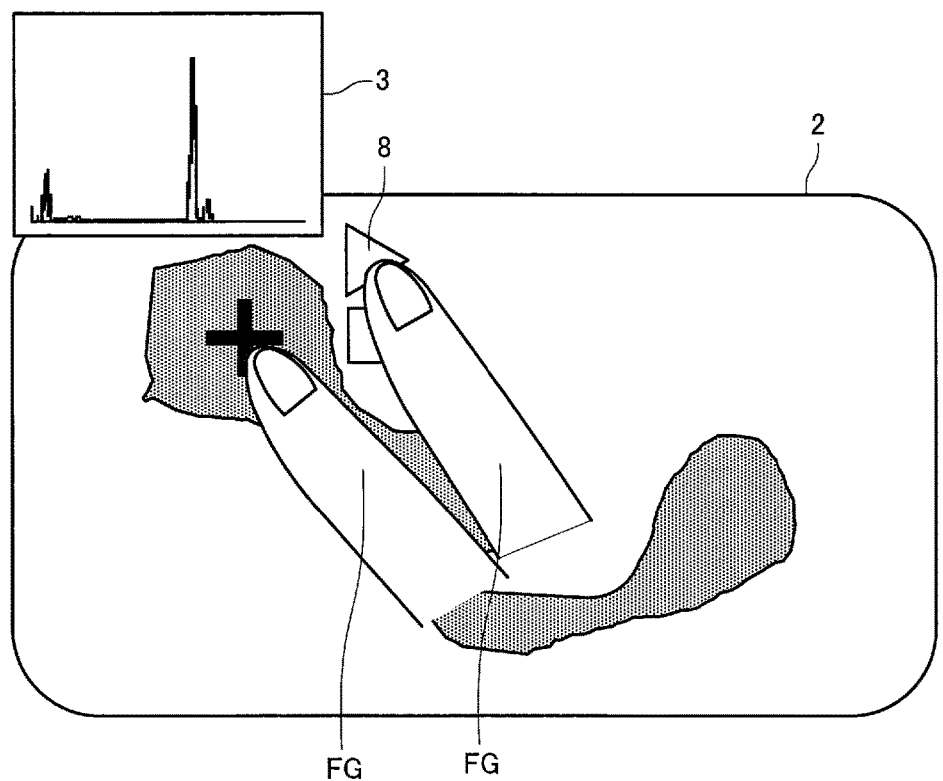
FIG. 16 illustrates an example of an operation that controls a spectrometer according to the second embodiment.

The analysis data output from the spectrometer 101 is stored in the storage section 40 when the spectrometer 101 has started analysis, and the EDS spectrum (analysis results) is displayed in the analysis result display area 3 (see FIG. 16). The spectrometer 101 continuously performs analysis while the user performs the operation that touches the analysis start icon 8 with the tip of the finger FG, and the analysis data is integrated. The integrated EDS spectrum is displayed in the analysis result display area 3.

Figure 17:
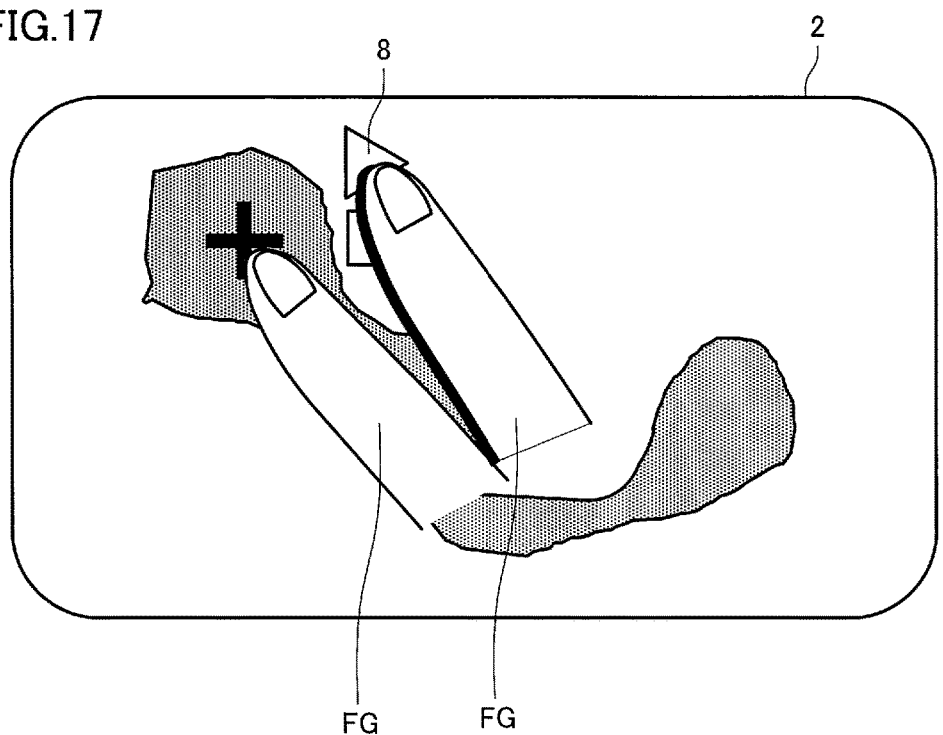
FIG. 17 illustrates an example of an operation that controls a spectrometer according to the second embodiment.
Figure 18:
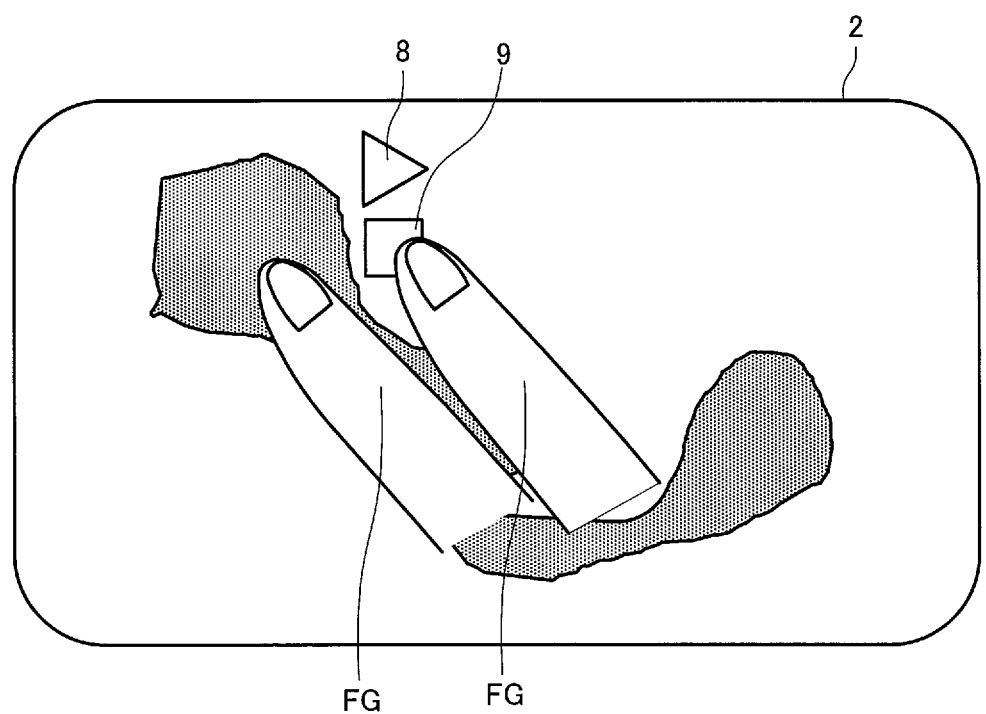
FIG. 18 illustrates an example of an operation that controls a spectrometer according to the second embodiment.

The spectrometer 101 stops analysis when the user has performed an operation (touch cancellation operation) that removes the tip of the finger FG from the analysis start icon 8 (see FIG. 17). The display of the EDS spectrum in the analysis result display area 3 is stopped, and the analysis data stored in the storage section 40 is deleted. Note that the spectrometer 101 may stop analysis when the user has performed an operation that removes the tip of the finger FG from the analysis position.

When the user has performed an operation that touches the analysis cancellation icon 9 with the tip of the finger FG (see FIG. 18) after the analysis start icon 8 and the analysis cancellation icon 9 have been displayed upon completion of the designation of the analysis position (see FIG. 14), the designation of the analysis position is canceled (i.e., the spectrometer 101 does not perform analysis at the analysis position).

2.3. Operation of Control Device

Figure 19:
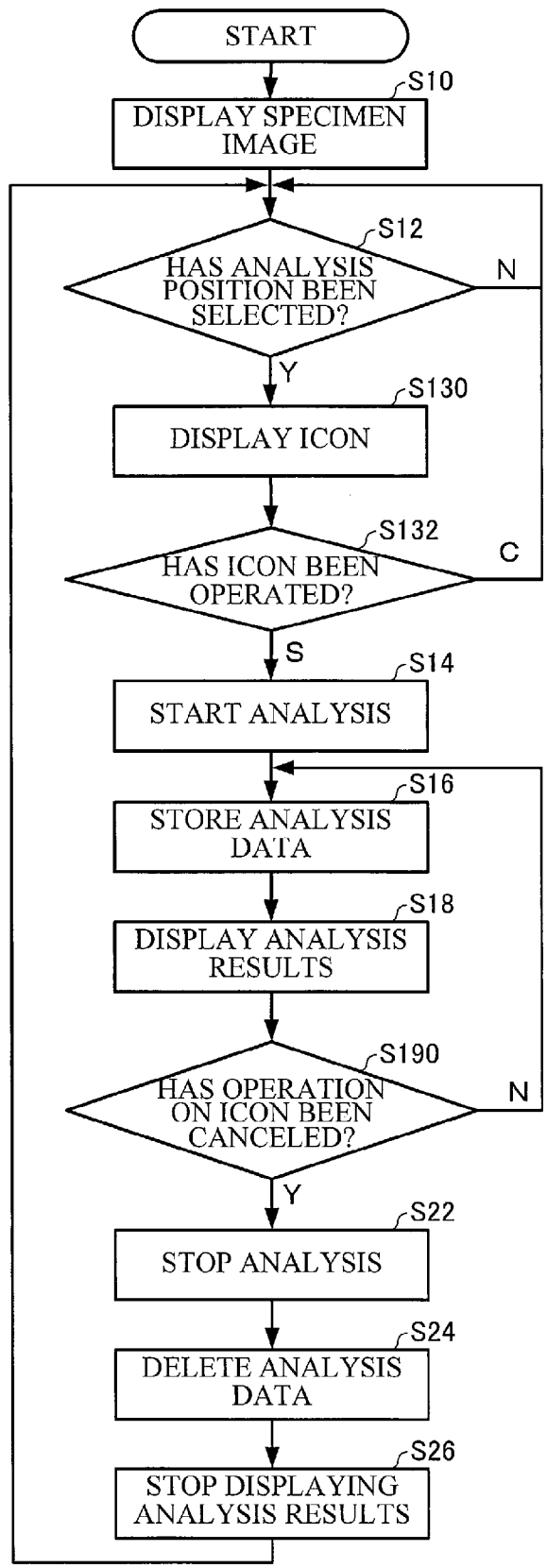
FIG. 19 is a flowchart illustrating an example of the operation of a control device according to the second embodiment.

The operation of the control device according to the second embodiment is described below. More specifically, the operation of the control device 200 in the first mode is described below. FIG. 19 is a flowchart illustrating an example of the operation of the control device 200. Note that the same steps illustrated in FIG. 19 (flowchart) as those illustrated in FIG. 6 (flowchart) are indicated by identical reference signs (symbols), and detailed description thereof is omitted.

The specimen image display control section 12 performs the control process that displays the electron microscope image (specimen image) acquired by the electron microscope 102 included in the spectrometer 101 on the display section 30 (specimen image display area 2) (step S10).

The determination section 13 then determines whether or not the designation of the analysis position within the specimen image displayed on the display section 30 has been performed by the user (step S12).

The icon display control section 19 performs a control process that displays the analysis start icon 8 and the analysis cancellation icon 9 on the display section 30 (step S130) when the determination section 13 has determined that the designation of the analysis position has been performed by the user ("Y" in step S12).

The determination section 13 then determines whether or not either the analysis start icon 8 or the analysis cancellation icon 9 has been operated (step S132). The determination section 13 determines that the analysis start icon 8 has been operated when the touch panel 20 has detected that the analysis start icon 8 has been touched. The determination section 13 determines that the analysis cancellation icon 9 has been operated when the touch panel 20 has detected that the analysis cancellation icon 9 has been touched.

When the determination section 13 has determined that the analysis cancellation icon 9 has been operated ("C" in step S132), the designation of the analysis position is canceled, and the step S12 is performed again.

The spectrometer control section 14 performs the control process that causes the spectrometer 101 to start analysis (step S14) when the determination section 13 has determined that the analysis start icon 8 has been operated ("S" in step S132) (i.e., based on the operation performed on the analysis start icon 8).

The spectrometer control section 14 performs the process that transmits the control signal that causes the spectrometer 101 to start analysis to the spectrometer 101 when the determination section 13 has determined that the analysis start icon 8 has been operated, for example.

The analysis result storage control section 16 starts the process that stores the analysis data output from the spectrometer 101 in the storage section 40 (step S16) when the determination section 13 has determined that the analysis start icon 8 has been operated ("S" in step S132).

The analysis result display control section 18 starts the control process that displays the EDS spectrum (analysis results) on the display section 30 (step S18) when the determination section 13 has determined that the analysis start icon 8 has been operated ("S" in step S132).

The determination section 13 then determines whether or not the operation on the analysis start icon 8 has been canceled by the user (step S190). The determination section 13 determines that the operation on the analysis start icon 8 has been canceled by the user when the touch panel 20 has detected that the touch operation on the analysis start icon 8 has been canceled (i.e., when an operation that removes the tip of the finger FG from the analysis start icon 8 has been detected).

The spectrometer control section 14 performs the control process that causes the spectrometer 101 to stop analysis (step S22) when the determination section 13 has determined that the operation on the analysis start icon 8 has been canceled by the user ("Y" in step S190).

The spectrometer control section 14 performs the process that transmits the control signal that causes the spectrometer 101 to stop analysis to the spectrometer 101 when the determination section 13 has determined that the operation on the analysis start icon 8 has been canceled by the user, for example. In this case, the electron microscope 102 included in the spectrometer 101 stops applying an electron beam to the analysis position.

The analysis result storage control section 16 performs the process that deletes the analysis data stored in the storage section 40 (step S24) when the determination section 13 has determined that the operation on the analysis start icon 8 has been canceled by the user ("Y" in step S190). The integrated analysis data stored in the storage section 40 is thus deleted.

The analysis result display control section 18 stops the control process that displays the EDS spectrum (analysis results) on the display section 30 (step S26) when the determination section 13 has determined that the operation on the analysis start icon 8 has been canceled by the user ("Y" in step S20). Therefore, the EDS spectrum is not displayed on the display section 30 (analysis result display area 3). The steps S12 to S26 are then repeated.

The steps S16 and S18 are performed again when the determination section 13 has determined that the operation on the analysis start icon 8 has not been canceled by the user ("N" in step S190). Specifically, the analysis data is integrated in the storage section 40, and the integrated EDS spectrum is displayed on the display section 30.

The control device 200 has the following features, for example.

The control device 200 is configured so that the icon display control section 19 performs the control process that displays the analysis start icon 8 on the display section 30 when the designation of the analysis position within the specimen image has been performed by the touch panel 20, and the spectrometer control section 14 performs the control process that causes the spectrometer 101 to start analysis based on the operation on the analysis start icon 8 that has been performed by the touch panel 20, and performs the control process that causes the spectrometer 101 to stop analysis based on the cancellation of the operation on the analysis start icon 8. According to this configuration, since the user need not operate an icon for stopping analysis, it is possible to improve the operability of the spectrometer, and reduce the analysis time, for example. It is also possible to reduce the possibility that it is erroneously determined that the user has performed an operation that designates the analysis position. For example, it is possible to reduce the possibility that an operation that moves the specimen is erroneously determined to be an operation that designates the analysis position.

3. Third Embodiment

Figure 20:
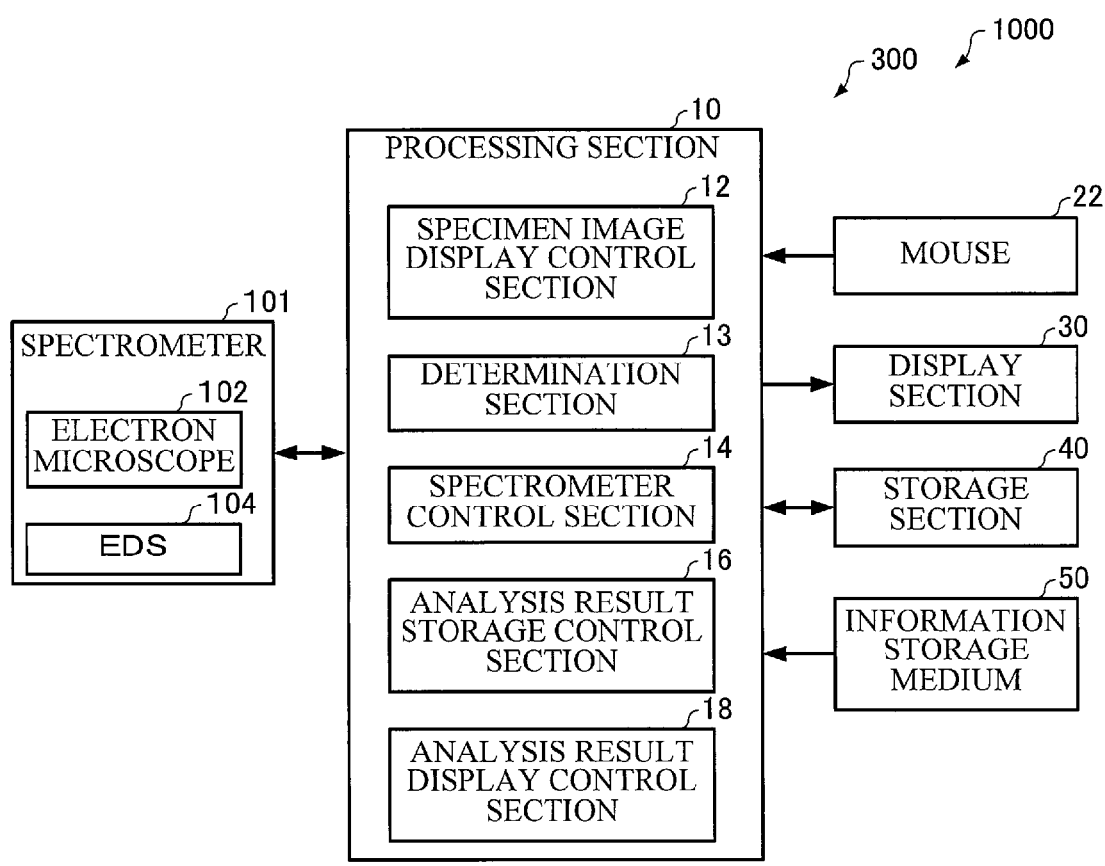
FIG. 20 is a functional block diagram illustrating an analysis system that includes a control device according to the third embodiment.

An analysis system that includes a control device according to a third embodiment is described below. FIG. 20 illustrates an example of a functional block diagram of an analysis system 1000 that includes a control device 300 according to the third embodiment. Note that the elements of the analysis system that includes the control device according to the third embodiment that are identical in function to those of the analysis system that includes the control device according to the first embodiment and the analysis system that includes the control device according to the second embodiment are indicated by the same reference signs (symbols), and detailed description thereof is omitted.

The control device 100 utilizes the touch panel 20 as the pointing means (see FIG. 1). On the other hand, the control device 300 utilizes a mouse 22 as the pointing means (see FIG. 20).

For example, when the user desires to designate the analysis position as illustrated in FIG. 3 by using the mouse 22, the user places a mouse cursor in an arbitrary area within the specimen image display area 2 with the mouse 22, and clicks the mouse 22. The analysis position is thus designated, and the spectrometer 101 starts analysis at the designated analysis position.

The spectrometer 101 continuously performs analysis while the user clicks the mouse 22, and the analysis data is continuously integrated. The integrated EDS spectrum is displayed in the analysis result display area 3.

When the user desires to cancel the designation of the analysis position as illustrated in FIG. 5 by using the mouse 22, the user stops clicking the mouse 22. The designation (selection) of the analysis position is thus canceled, and the spectrometer 101 stops analysis. The display of the EDS spectrum in the analysis result display area 3 is stopped, and the analysis data stored in the storage section 40 is deleted.

The control device 300 can achieve the same advantageous effects as those achieved by the control device 100 (see above).

Although an example in which the control device 300 utilizes a mouse as the pointing means has been described above, a mouse may also be used as the pointing means in connection with the modifications of the control device 100, and the control device 200.

Note that the above embodiments and the modifications thereof are merely examples, and the invention is not limited to the above embodiments and the modifications thereof. For example, the above embodiments and the modifications thereof may be appropriately combined.

The invention includes various other configurations substantially the same as the configurations described in connection with the above embodiments (e.g., a configuration having the same function, method, and results, or a configuration having the same objective and effects). The invention also includes a configuration in which an unsubstantial element described in connection with the above embodiments is replaced with another element. The invention also includes a configuration having the same effects as those of the configurations described in connection with the above embodiments, or a configuration capable of achieving the same objective as that of the configurations described in connection with the above embodiments. The invention further includes a configuration in which a known technique is added to the configurations described in connection with the above embodiments.

Although only some embodiments of the invention have been described in detail above, those skilled in the art would readily appreciate that many modifications are possible in the embodiments without materially departing from the novel teachings and advantages of the invention. Accordingly, all such modifications are intended to be included within the scope of the invention.

What is claimed is:

1. A control device that controls a spectrometer, the control device comprising:
   a specimen image display control section that performs a control process that displays a specimen image acquired by the spectrometer on a display section;
   an icon display control section that performs a control process that displays an analysis start icon on the display section when designation of an analysis position within the specimen image has been performed by a pointing device;
   an spectrometer control section that performs a control process that causes the spectrometer to start analysis based on an operation on the analysis start icon that has been performed by the pointing device, and performs a control process that causes the spectrometer to stop the analysis based on cancellation of the operation on the analysis start icon; and
   an analysis result storage control section that performs a control process that stores analysis data output from the spectrometer in a storage section,
   wherein the analysis result storage control section starts the control process that stores the analysis data in the storage section based on the designation of the analysis position, and performs a process that deletes the analysis data stored in the storage section based on the cancellation of the designation of the analysis position.

2. The control device as defined in claim 1, further comprising:
   an analysis result display control section that performs a control process that displays analysis results of the spectrometer on the display section,
   wherein the analysis result display control section starts the control process that displays the analysis results on the display section based on the designation of the analysis position, and stops the control process that displays the analysis results on the display section based on the cancellation of the designation of the analysis position.

3. A control method that controls a spectrometer, the control method comprising:
   performing a control process that displays a specimen image acquired by the spectrometer on a display section;
   performing a control process that displays an analysis start icon on the display section when designation of an analysis position within the specimen image has been performed by a pointing device;
   performing a control process that causes the spectrometer to start analysis based on an operation on the analysis start icon that has been performed by the pointing device;
   performing a control process that causes the spectrometer to stop the analysis based on cancellation of the operation on the analysis start icon;
   starting a process that stores analysis data output from the spectrometer in a storage section based on the designation of the analysis position; and
   performing a process that deletes the analysis data stored in the storage section based on the cancellation of the designation of the analysis position.

4. The control method as defined in claim 3, further comprising:
   starting a control process that displays analysis results of the spectrometer on the display section based on the designation of the analysis position; and
   stopping the control process that displays the analysis results on the display section based on the cancellation of the designation of the analysis position.

* * * * *